United States Patent
Kariya et al.

(10) Patent No.: US 8,108,990 B2
(45) Date of Patent: Feb. 7, 2012

(54) METHOD FOR MANUFACTURING PRINTED CIRCUIT BOARD

(75) Inventors: Takashi Kariya, Ibi-gun (JP); Hironori Tanaka, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 331 days.

(21) Appl. No.: 12/255,699

(22) Filed: Oct. 22, 2008

(65) Prior Publication Data

US 2009/0064493 A1 Mar. 12, 2009

Related U.S. Application Data

(62) Division of application No. 11/580,928, filed on Oct. 16, 2006, now Pat. No. 7,888,803.

(30) Foreign Application Priority Data

Oct. 14, 2005 (JP) .................................. 2005-300320

(51) Int. Cl.
*H05K 3/00* (2006.01)

(52) U.S. Cl. ................ 29/829; 29/830; 29/831; 29/832; 29/25.41; 29/25.42

(58) Field of Classification Search .................... 29/852, 29/829, 830, 831, 832, 25.41, 25.42, 866, 29/867, 868; 361/763, 766, 774, 773; 438/106, 438/107, 108, 584; 174/256, 255; 257/774, 257/296, 295, 301, 303, 310, 724
See application file for complete search history.

(56) References Cited

U.S. PATENT DOCUMENTS

| | | | |
|---|---|---|---|
| 5,347,696 A * | 9/1994 | Willer et al. .................. | 29/25.42 |
| 5,701,647 A * | 12/1997 | Saenger et al. ............... | 438/396 |
| 5,719,416 A * | 2/1998 | Yoshimori et al. ............ | 257/295 |
| 5,826,330 A | 10/1998 | Isoda et al. | |
| 5,914,851 A * | 6/1999 | Saenger et al. ............... | 361/311 |
| 6,255,157 B1 | 7/2001 | Hsu et al. | |
| 6,884,655 B2 * | 4/2005 | Iljima et al. ................... | 438/107 |
| 7,079,198 B2 * | 7/2006 | Miyazaki et al. .............. | 349/38 |
| 7,312,146 B2 | 12/2007 | Cheung et al. | |
| 7,476,922 B2 | 1/2009 | Won et al. | |
| 2003/0068517 A1 | 4/2003 | Andresakis et al. | |
| 2003/0150644 A1 | 8/2003 | Takada et al. | |
| 2004/0012938 A1 | 1/2004 | Sylvester et al. | |
| 2005/0056878 A1 | 3/2005 | Shioga et al. | |

FOREIGN PATENT DOCUMENTS

| | | |
|---|---|---|
| EP | 1 545 175 A2 | 6/2005 |
| EP | 1 696 716 A1 | 8/2006 |
| JP | 11-307944 | 11/1999 |
| JP | 2005-191559 | 7/2005 |

* cited by examiner

*Primary Examiner* — Derris Banks
*Assistant Examiner* — Tai Nguyen
(74) *Attorney, Agent, or Firm* — Oblon, Spivak, McClelland, Maier & Neustadt, L.L.P.

(57) ABSTRACT

A printed circuit board including a conductor portion, an insulating layer formed over the conductor portion, a thin-film capacitor formed over the insulating layer and including a first electrode, a second electrode and a high-dielectric layer interposed between the first electrode and the second electrode, and a via-hole conductor structure formed through the second electrode and insulating layer and electrically connecting the second electrode and the conductor portion. The via-hole conductor structure has a first portion in the second electrode and a second portion in the insulating layer. The first portion of the via-hole conductor structure has a truncated-cone shape tapering toward the conductor portion.

20 Claims, 8 Drawing Sheets

METHOD FOR MANUFACTURING PRINTED CIRCUIT BOARD

CROSS-REFERENCE TO RELATED APPLICATIONS

The present application is a divisional of and claims the benefit of priority under 35 U.S.C. §120 from U.S. Ser. No. 11/580,928, filed Oct. 16, 2006, and claims the benefit of priority under 35 U.S.C. §119 from Japanese Patent Application No. 2005-300320, filed Oct. 14, 2005. The contents of that application are incorporated herein by reference in their entirety.

BACKGROUND OF THE INVENTION

1. Field of the Invention

The present invention relates to a printed circuit board (hereinafter referred to as "PCB").

2. Discussion of the Background

Japanese Patent Laid-Open Publication 2005-191559 describes a PCB which has a build-up part having alternately superimposed conductive layers and insulating layers and a thin-film capacitor constructed of a ceramic high-dielectric layer sandwiched between an upper electrode and a lower electrode.

However, in the PCB according to the above reference, problems such as electrical disconnection and short-circuits occur when it is put through a heat cycle test in which the PCB is exposed to a cycle of a low temperature and a high temperature alternating for hundreds of times. The contents of the foregoing publication are incorporated herein by reference in their entirety.

SUMMARY OF THE INVENTION

According to one aspect of the present invention, a printed circuit board includes a conductor portion, an insulating layer formed over the conductor portion, a thin-film capacitor formed over the insulating layer and having a first electrode, a second electrode and a high-dielectric layer interposed between the first electrode and the second electrode, and a via-hole conductor structure formed through the second electrode and insulating layer and electrically connecting the second electrode and the conductor portion. The via-hole conductor structure has a first portion in the second electrode and a second portion in the insulating layer. The first portion of the via-hole conductor structure has a truncated-cone shape tapering toward the conductor portion.

According to another aspect of the present invention, a method for manufacturing a printed circuit board includes preparing a structure including one or more conductor portions, an insulating layer formed over the conductor portions, and a thin-film capacitor formed over the insulating layer and having a first electrode, a second electrode and a high-dielectric layer interposed between the first electrode and the second electrode, forming a first hole passing through the thin-film capacitor and having a truncated-cone shape tapering toward one of the conductor portions, forming a second hole passing through the insulating layer and reaching the conductor portion, and filling one or more conductive materials in the first and second holes such that a via-hole conductor structure through the second electrode and insulating layer and electrically connecting the second electrode and the conductor portion is formed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

The embodiments will now be described with reference to the accompanying drawings, wherein like reference numerals designate corresponding or identical elements throughout the various drawings.

Figure 1:
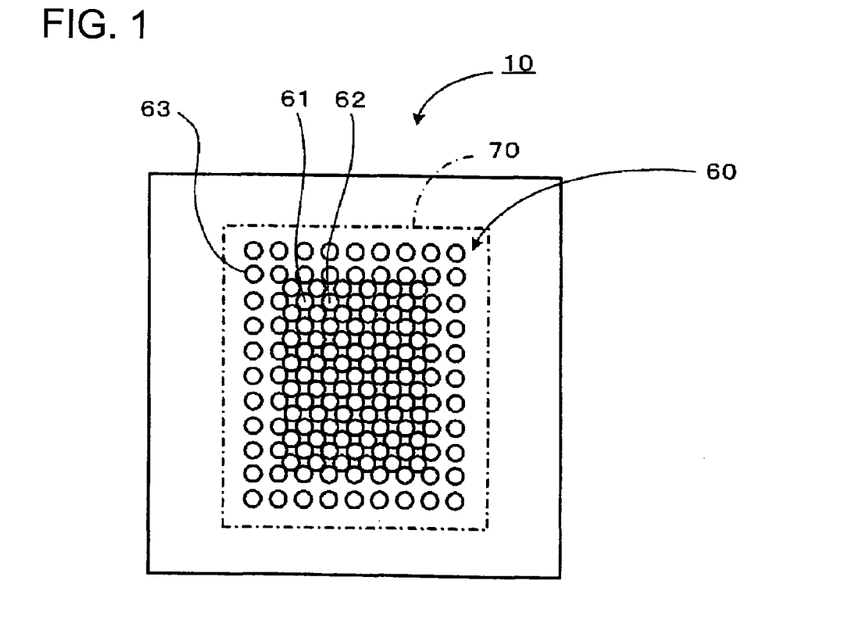
FIG. 1 is a plan view of multilayered PCB according to one embodiment of the present invention.

FIG. 1 is a plan view of a multilayered PCB 10 according to one embodiment of the present invention. Referring to FIG. 1, multilayered PCB 10 according to this embodiment has a mounting part 60, with a semiconductor component 70 mounted on its upper surface. In the mounting part 60, ground pads 61, power source pads 62 and signal pads 63 are provided. The ground pads 61 are used for connection to a ground line which grounds the semiconductor element 70. The power source pads 62 are for connection to a power source line which supplies an electrical potential from a power source to the semiconductor element 70. The signal pads 63 are provided for connection to a signal line which inputs and outputs signals to and from the semiconductor element 70. According to the present embodiment, ground pads 61 and power source pads 62 are positioned either in a lattice pattern or a zigzag pattern around the center of the mounting part 60, and signal pads 63 are positioned around those pads in a lattice pattern, in a zigzag pattern or at random. The total number of pads on mounting part 60 is 1,000-30,000.

Figure 12:
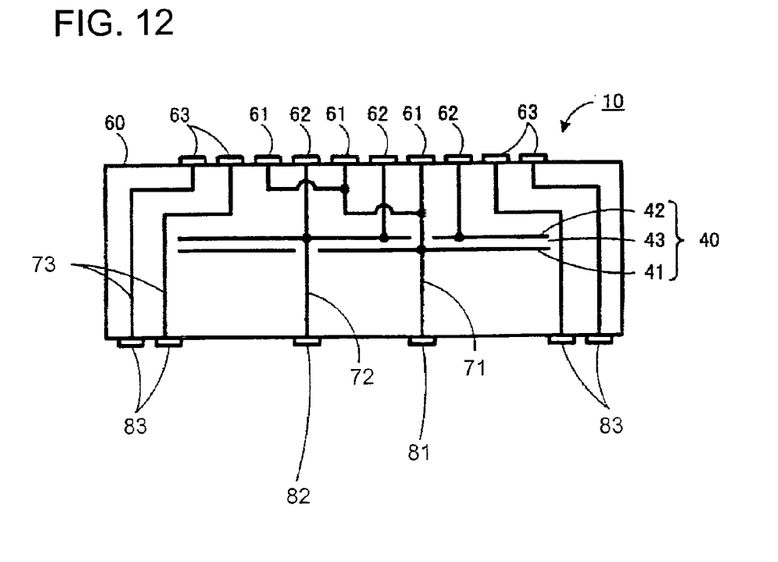
FIG. 12 is a schematic illustration of multilayered PCB showing connections between pads and lines according to one embodiment of the present invention.

FIG. 12 is a schematic illustration of multilayered PCB showing connections between pads and lines. Referring to FIG. 12, multilayered PCB 10 has external terminals located on the surface opposite to mounting part 60. Specifically, an external ground terminal 81, an external power source terminal 82 and external signal terminals 83 are provided and connected with ground pads 61, power source pads 62 and signal pads 63 through a ground line 71, a power source line 72 and signal lines 73, respectively. The ground line 71 is provided independent from the power source line 72 and signal lines 73 in the multilayered PCB 10, and is connected to lower electrode 41 of thin-film capacitor 40. The power source line 72 is provided independent from the ground line 71 and signal lines 73 in the multilayered PCB 10, and is connected to upper electrode 42 of thin-film capacitor 40 (see FIG. 2). The signal lines 73 are formed independent from the power source line 72 and ground line 71 in the multilayered PCB 10.

Figure 2:
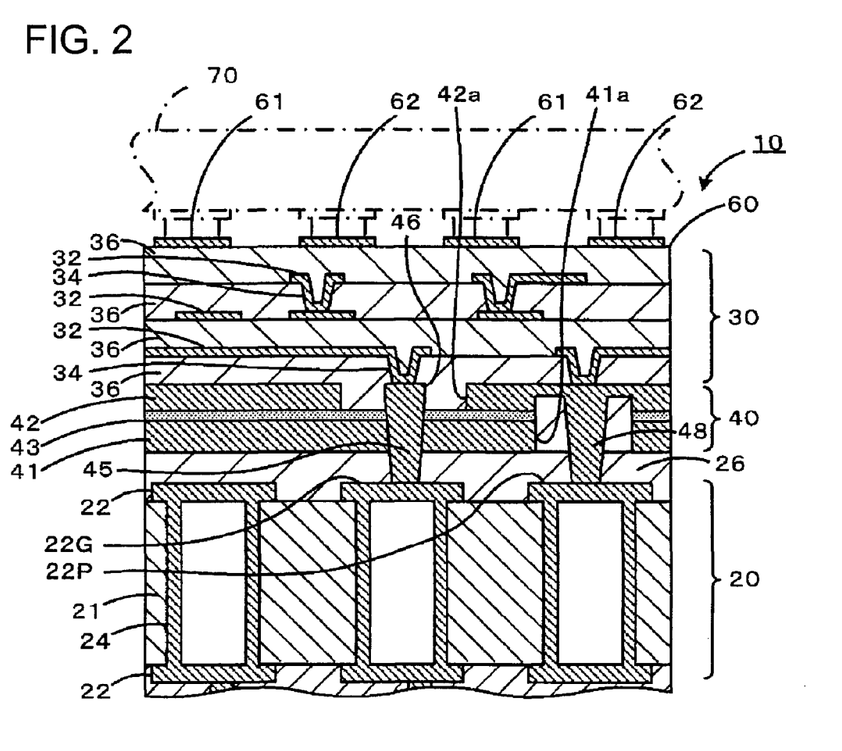
FIG. 2 is a cross-sectional view of a portion of multilayered PCB according to one embodiment of the present invention.

FIG. 2 is a cross-sectional view of a portion of the multilayered PCB 10. Referring to FIG. 2, multilayered PCB 10 has a core substrate 20, a build-up part 30 and a thin-film capacitor 40. The thin-film capacitor 40 is formed above core substrate 20 with an insulation layer 26 provided therebetween. The build-up part 30 is formed above thin-film capacitor 40, and mounting part 60 is formed on the topmost layer of build-up part 30. Each of ground pads 61, power source pads 62 and signal pads 63 provided in mounting part 60 is electrically connected to conductive layers 32 (BU conductive layers) which are conductor portions forming wiring patterns inside build-up part 30. Core substrate 20 has conductive layers 22 and a through-hole conductor 24. Conductive layers 22 are made of copper and formed on the top and bottom surfaces of a core substrate body 21, which is made of BT (bismaleimide-triazine) resin or glass epoxy substrate or the like. The through-hole conductor 24 is made of copper and provided on the inner surface of the though-hole which passes through core substrate body 21. Conductive layers 22 are electrically connected to each other via through-hole conductor 24.

Figure 3:
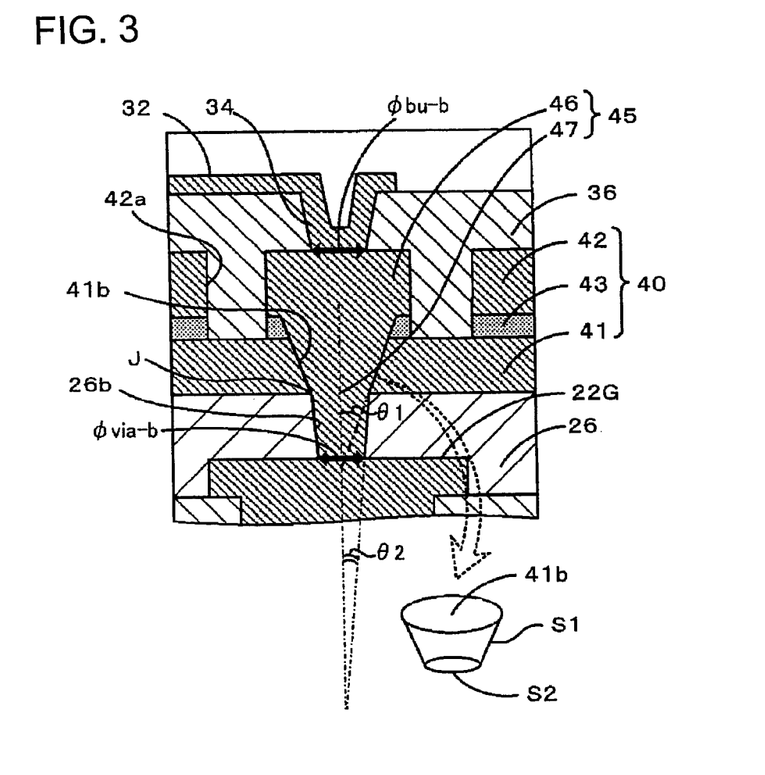
FIG. 3 is a partially enlarged view of FIG. 2.
Figure 4:
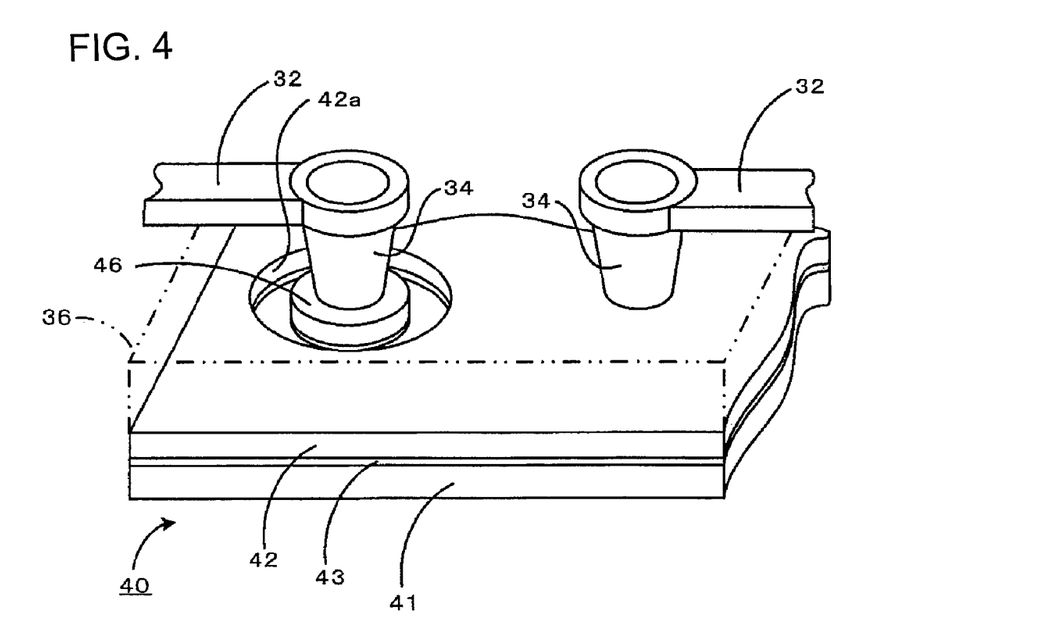
FIG. 4 is a cross-sectional view of thin-film capacitor inside multilayered PCB.

FIG. 3 is a partially enlarged view of FIG. 2, and FIG. 4 is a perspective view of a thin-film capacitor 40 provided inside the multilayered PCB 10. As shown in FIGS. 2-4, thin-film capacitor 40 has a high-dielectric layer 43, a lower electrode 41 and an upper electrode 42. Lower electrode 41 and upper electrode 42 sandwich high-dielectric layer 43 which is made of a ceramic-type high-dielectric material produced by calcining a high-dielectric material at a high temperature. Lower electrode 41 and upper electrode 42 are made of nickel and copper, respectively.

As illustrated in FIG. 12, lower electrode 41 is electrically connected to ground pads 61 in mounting part 60, while upper electrode 42 is electrically connected to power source pads 62 in mounting part 60. Therefore, lower electrode 41 and upper electrode 42 are connected respectively to the ground line and power source line of semiconductor element 70 mounted on mounting part 60.

Referring back to FIG. 2, lower electrode 41 is a plane pattern formed below high-dielectric layer 43, and has a through-hole (41a) which allows an upper via-hole conductor 48 to vertically pass through without making contact. Upper via-hole conductor 48 electrically connects the upper electrode 42 with a power source conductive layer (22P), which is one of the conductive layers 22 on core substrate 20. Lower electrode 41 may have a through-hole for each signal line to pass through lower electrode 41 without contact. However, it is preferred that each signal line be formed outside lower electrode 41 (see FIG. 12). Upper electrode 42 is a plane pattern formed on top of high-dielectric layer 43, and has a through-hole (42a) which allows a lower via-hole conductor 45 to pass through upper electrode 42 without making contact. Lower via-hole conductor 45 electrically connects lower electrode 41 with a ground conductive layer (22G), which is one of the conductive layers 22 on core substrate 20. Upper electrode 42 may have a through-hole for each signal line to vertically pass through without contact. However, it is preferred that each signal line be formed outside upper electrode 42 (see FIG. 12). High-dielectric layer 43 is of a ceramic type and is made by forming a high-dielectric material containing one or more metal oxides selected from $BaTiO_3$, $SrTiO_3$, $TaO_3$, $Ta_2O_5$, PZT, PLZT, PNZT, PCZT and PSZT into a film having a thickness in the range of 0.1-10 μm and calcining it.

Referring to FIG. 3, lower via-hole conductor 45 has a disc part 46 and a main conductor part 47. The disc part 46 is detached from the internal circumference of an upper electrode through-hole (42a). The main conductor part 47 is formed by filling conductive material (metal or electro-conductive resin) into lower electrode through-hole (41b) passing through lower electrode 41 and insulating layer through-hole (26b) passing through insulating layer 26 located under capacitor 40. Disc part 46 and main conductor part 47 are integrally formed as one element. Lower electrode through-hole (41b) has a truncated-cone shape, tapering downward. The area (S1) of side surface of the truncated cone (i.e., the area of side wall of lower electrode through-hole (41b)) is made larger than the area (S2) of bottom surface of the truncated cone (i.e., the bottom opening of lower electrode through-hole (41b) at the bottom of lower electrode 41). Insulating layer through-hole (26b) also has a truncated-cone shape, tapering downward. The taper angle (θ1) of lower electrode through-hole (41b) is made greater than the taper angle (θ2) of insulating layer through-hole (26b). As a result, the generatrices of insulating layer through-hole (26b) and lower electrode through-hole (41b) form an angle at their junction point (J). Insulating layer through-hole (26b) may also be formed as a cylinder whose cross-section is the same dimension as the bottom surface of lower electrode through-hole (41b). In such an embodiment, the generatrices of insulating layer through-hole (26b) and lower electrode through-hole (41b) also form an angle. Further, the diameter (Φvia-b) of the bottom surface of lower via-hole conductor 45 (the area which contacts conductive layer (22G) of core substrate 20) is made smaller than the diameter (Φbu-b) of the bottom surface of BU via-hole conductor 34 (the area which contacts disc part 46). Since lower electrode through-hole (41b) is a tapering hole (a truncated-cone shape), the surface area where lower via-hole conductor 45 makes contact with lower electrode 41 is made larger compared to that of a cylindrical hole.

Referring to FIG. 2, build-up part 30 is formed above thin-film capacitor 40 by alternately laminating build-up part insulating layers 36 (BU insulating layers) and BU conductive layers 32. Each of BU conductor layers 32 may have one or more conductive portions forming a conductive circuit. BU conductive layers 32, which vertically sandwich BU insulating layers 36, are electrically connected to each other through a BU via-hole conductor 34. BU conductive layer 32 is also electrically connected to thin-film condenser 40 through BU via-hole conductor 34. As BU part 30 is made thinner, BU conductive layer 32 is formed thinner than lower electrode 41.

BU part 30 as described above may be formed by, for example, a subtractive or additive process (including semi-additive or full-additive processes). Specifically, a resin insulating sheet is first laminated on top and bottom surfaces of core substrate 20 to form BU insulating layers 36 (having Young's modulus of, for example, 2-7 GPa, at room temperature). The resin sheet used above is made of a denatured epoxy-based resin, polyphenylene ether type resin, polyimide type resin, cyano ester type resin, or the like, and its thickness is in the approximate range of 20-80 μm. Inorganic materials such as silica, alumina, zirconia, or the like, may be dispersed in such a resin sheet. Next, through-holes are formed in the above-laminated resin sheet by using a $CO_2$ gas laser, UV laser, YAG laser, excimer laser, or the like, then the surfaces of the resin sheets and the inner surfaces of the through-holes are plated with electroless copper to make conductive layers. A plating resist is formed in areas on the conductive layers, and electrolytic copper plating is applied except the areas where the plating resist is formed. BU conductive layers 32 are formed after the electroless copper plating under the resist is removed with an etching solution. The inner surfaces of the through-hole become BU via-hole conductors 34. The above process is repeated to form build-up part 30. In the present embodiment, lower electrode 41 of thin-film capacitor 40 is made thicker than BU conductive layer 32.

The above-described multilayered PCB 10 has, for example, the following use. First, semiconductor element 70, having solder bumps on its bottom surface, is installed on mounting part 60. During the mounting procedure, ground, power source and signal terminals of semiconductor element 70 are brought into contact respectively with ground pads 61, power source pads 62, and signal pads 63 of mounting part 60, and soldered by a reflow process. Then, multilayered PCB 10 is installed on another PCBs such as a motherboard. Before the installment, solder bumps are formed on a pad provided on the bottom surface of the multilayered PCB 10. The pad is connected to the corresponding pad of another PCB by a reflow process. Because thin-film capacitor 40 provided in multilayered PCB 10 has high-dielectric layer 43 made of high-permittivity ceramic, and because lower electrode 41 and upper electrode 42 are large plane patterns (may include partially open areas), the thin-film capacitor 40 has a larger capacitance. Thus, the thin-film capacitor 40 produces a sufficient decoupling effect, thereby reducing the risk of lower power supply at a transistor of semiconductor element 70 (IC) provided on mounting part 60. Chip-capacitors may be installed around mounting part 60 of multilayered PCB 10.

Figure 5:
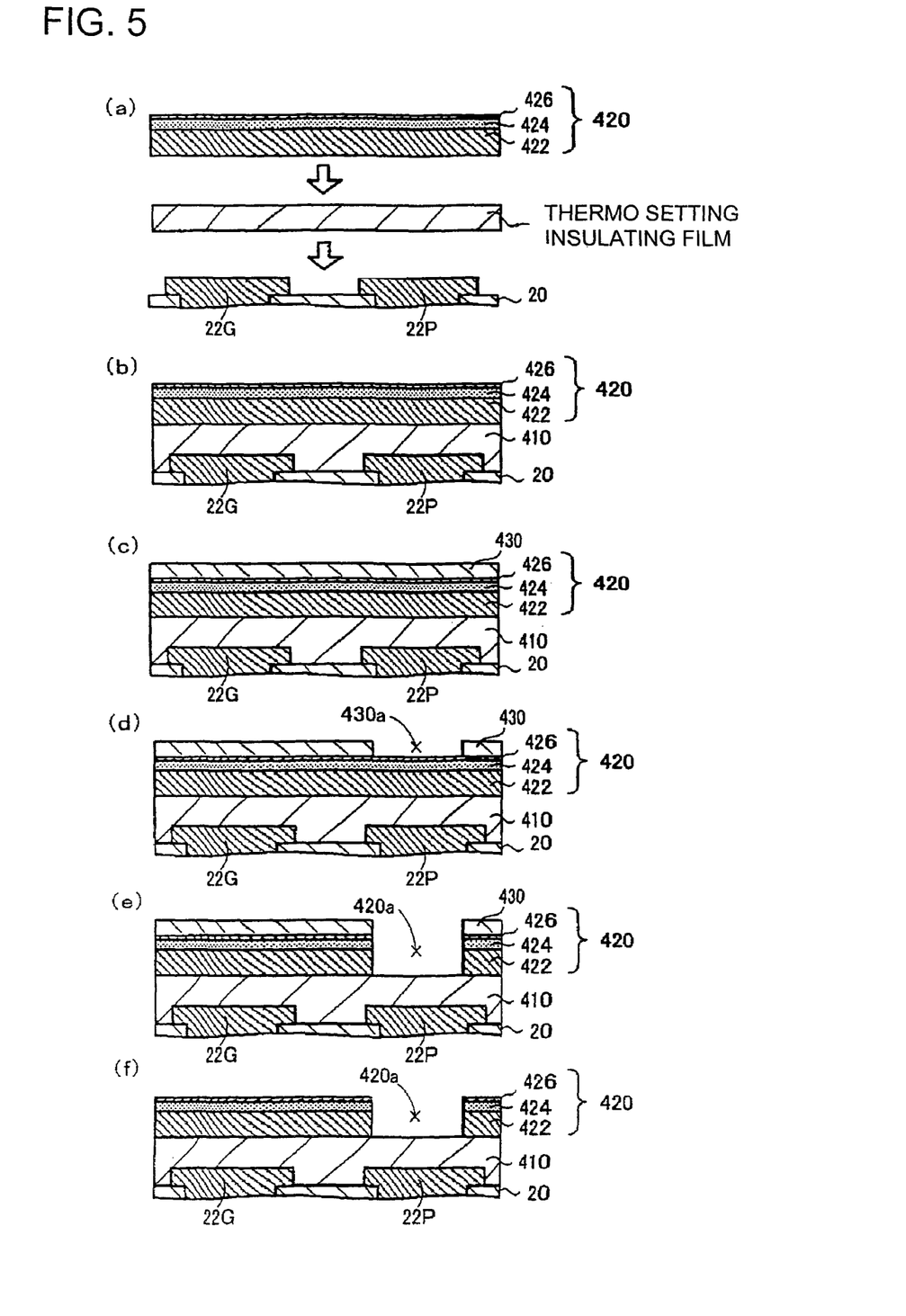
FIGS. 5(a)-5(f) are cross-sectional views of multilayered PCB being produced by a method according to one embodiment of the present invention.

FIGS. 5-9 are cross-sectional views of multilayered PCB 10 being produced according to one embodiment of the present invention. Referring to FIGS. 5-9, a manufacturing process of multilayered PCB 10 according to the present embodiment is described. First, as shown in FIG. 5(*a*), a thermosetting insulating film (ABF-45SH made by Ajinomoto Fine-Techno Co., Ltd.) is laminated on core substrate 20 by using a vacuum laminator under conditions of a temperature range of 50-150° C. and a pressure range of 0.5-1.5 MPa. This thermosetting insulating film becomes a form insulating layer 26 under thin-film capacitor 40 in FIG. 2. Then, a high-dielectric sheet 420 comprised of a high-dielectric layer 424 sandwiched between a metal foil 421 made of nickel and another metal foil 426 made of copper is attached onto the thermosetting insulating film by using a vacuum laminator under conditions of a temperature range of 50-150° C. and a pressure range of 0.5-1.5 MPa, and then dried for an hour at 150° C. (see FIG. 5(*b*)). Through the above process, the thermosetting resin film is hardened and became an interlayer insulating layer 410. The distance between nickel foil 422 of high-dielectric sheet 420 and the conductive layer 22 of core substrate 20 is 30 µm. In high-dielectric sheet 420, nickel foil 422 with a roughened surface is used. The roughened surface is made by using an interplate process (Ebara Udylite Co., Ltd.). In forming high-dielectric sheet 420, metal foils 422, 426 are plane layers without circuit patterns, respectively, for the following reasons. If metal foils 422, 426 are partially removed by etching or the like, (i) the ratio of remaining metal may differ on front and back surfaces, and/or high-dielectric sheet may bend or break at a removed portion; (ii) when a portion of metal foil is removed, edges are formed and laminating pressure is exerted toward the edges; and (iii) as the laminator makes direct contact with the high-dielectric layer, the high-dielectric layer become susceptible to cracking, and when cracks are filled with plating solution in a later process, short-circuiting between the metal foils may occur. Furthermore, if a portion of electrode is removed before lamination, capacitance of high-dielectric sheet is reduced, and when high-dielectric sheet is laminated, high-dielectric sheet and core substrate 20 have to be aligned. Also, high-dielectric layer being rather thin and lacking strength, it is difficult to remove a portion of metal foil with positional accuracy. In addition, because a portion of metal foil is removed with consideration of alignment accuracy, a larger piece of metal foil is removed, and because high-dielectric sheet is thin, alignment accuracy is deteriorated. Therefore, when high-dielectric sheet 420 is laminated, it is preferable that both metal foils 422, 426 are plane layers without circuit patterns, respectively.

A manufacturing process of high-dielectric sheet 420 is described below.

(1) Diethoxy barium and titanium bitetraisopropoxide are weighed in a dry nitrogen atmosphere to prepare a solution with a concentration of 1.0 mol/liter in a mixed solvent of dehydrated methanol and 2-methoxyethanol (volume ratio 3:2). Then, the solution is blended for three days in a nitrogen atmosphere at room temperature to prepare a solution containing a barium-titanium alkoxide precursor composition. Decarbonated water is sprayed at a speed of 0.5 microliter/minute in an atmospheric nitrogen current to hydrolyze the precursor composition solution while blending it at a constant temperature of 0° C. until it becomes a sol-gel solution.

(2) The sol-gel solution prepared in (1) is filtered through a 0.2-micron filter to remove precipitates.

(3) The filtered solution from (2) is then spincoated on metal film 422 made of nickel film (later to become lower electrode 41) at a speed of 1,500 rpm for 1 minute. The spincoated substrate is dried for 3 minutes on a hot plate at a constant temperature of 150° C., then put in an electric oven having a constant temperature of 850° C. to calcine for 15 minutes. The viscosity of the solution was adjusted so that the film thickness obtained in a spincoat/dry/calcine cycle becomes 0.03 µm. For lower electrode 41, copper, platinum, gold or silver may be used other than nickel.

(4) By repeating the spincoat/dry/calcine cycle for twenty five times, a high-dielectric layer 424 having a thickness of 0.75 µm is obtained.

(5) Subsequently, a copper layer is formed on high-dielectric layer 424 by a vacuum deposition device such as a sputtering device. Then, copper in a thickness of approximately 10 µm is added over the copper layer by electrolytic plating or the like, thereby forming metal foil 426 (later to become a part of upper electrode 42). The dielectric characteristics of the high-dielectric sheet obtained according to the above-described procedures are measured using an Impedance/Gain-Phase Analyzer (4194A, made by Hewlett-Packard Development Co., L.P.) under the conditions calling for a frequency of 1 Hz, a temperature of 25° C. and an OSC level of 1V. The relative dielectric constant was 1,300. For the vacuum deposition, besides copper, metals such as platinum or gold may be used to form a metal layer. For the electrolytic plating, besides copper, metals such as nickel or tin may be used to form a metal layer. The high-dielectric layer is made of barium titanium in the present embodiment. However, any of the following may be used: strontium titanate ($SrTiO_3$), tantalum oxide ($TaO_3$, $Ta_2O_5$), lead zirconate titanate (PZT), lead lanthanum zirconate titanate (PLZT), lead niobium zirconate titanate (PNZT), lead calcium zirconate titanate (PCZT) and lead strontium zirconate titanate (PSZT).

Alternatively, high-dielectric sheet 420 may be produced by the following processes. Barium Titanate powder (HPBT series, made by Fuji Titanium Industry Co., Ltd.) is dispersed in a binder solution. The binder solution contains 5 parts by weight of polyvinyl alcohol, 50 parts by weight of purified water, 1 part by weight of either dioctyl phthalate or dibutyl phthalate as a solvent-type plasticizer with respect to the total weight of the barium titanate powder. Using a printer such as a roll-coater, doctor blade, or α-coater, the binder solution is printed on a nickel foil 422 having a thickness of 14 μm to form a thin-film with an approximate thickness in the range of 5-7 μm. The coated film is then dried for 1 hour at 60° C., for 3 hours at 80° C., for 1 hour at 100° C., for 1 hour at 120° C. and for 3 hours at 150° C., thereby making an uncalcined layer. Besides $BaTiO_3$, a paste containing one or more metal oxides among $SrTiO_3$, $Ta_2O_5$, PZT, PLZT, PNZT, PCZT and PSZT may be printed on a nickel foil 422 by using a printer such as a roll-coater or doctor blade, thereby forming a thin film of 0.1-10 μm thick, and then dried to form an uncalcined thin-film. After the printing process, the uncalcined layer is calcined at a temperature in the range of 600-950° C., thereby forming high-dielectric layer 424. Subsequently, a layer of copper is formed on high-dielectric layer 424 by vacuum deposition such as sputtering, and then copper in approximately 2-10 μm thick is deposited over the copper layer by electrolytic plating, thus forming a metal foil 426 made of copper. For the vacuum deposition, other than copper, metals such as platinum or gold may be used to form a metal layer, and for the electrolytic plating, other than copper, metals such as nickel or tin may be sued to form a metal layer. For the above procedure, sputtering using barium titanate as a target may be used.

Referring to FIGS. 5(c)-5(f), a dry film 430 (etching resist) is attached on unfinished substrate with high-dielectric sheet 420 (see FIG. 5(c)), a circular opening (430a) is formed at the position above conductive layer (22P) of core substrate 20 through exposure and development for forming a patterning on multilayered PCB (see FIG. 5(d)), etching is performed (see FIG. 5(e)), and then the dry film is removed (see FIG. 5(f)). As a result, a cylindrical hole (420a) is formed in high-dielectric sheet 420 at the position opposing conductive layer (22P) of core substrate 20. In the etching process above, copper (II) chloride etching solution is used. Alternatively, cylindrical hole (420a) may be formed without attaching dry film 430 on metal foil 426, but by irradiating a UV laser at a predetermined position. In such a case, cylindrical hole may pass through metal foil 426, high-dielectric layer 424 and metal foil 422, to reach conductive layer (22P).

Figure 6:
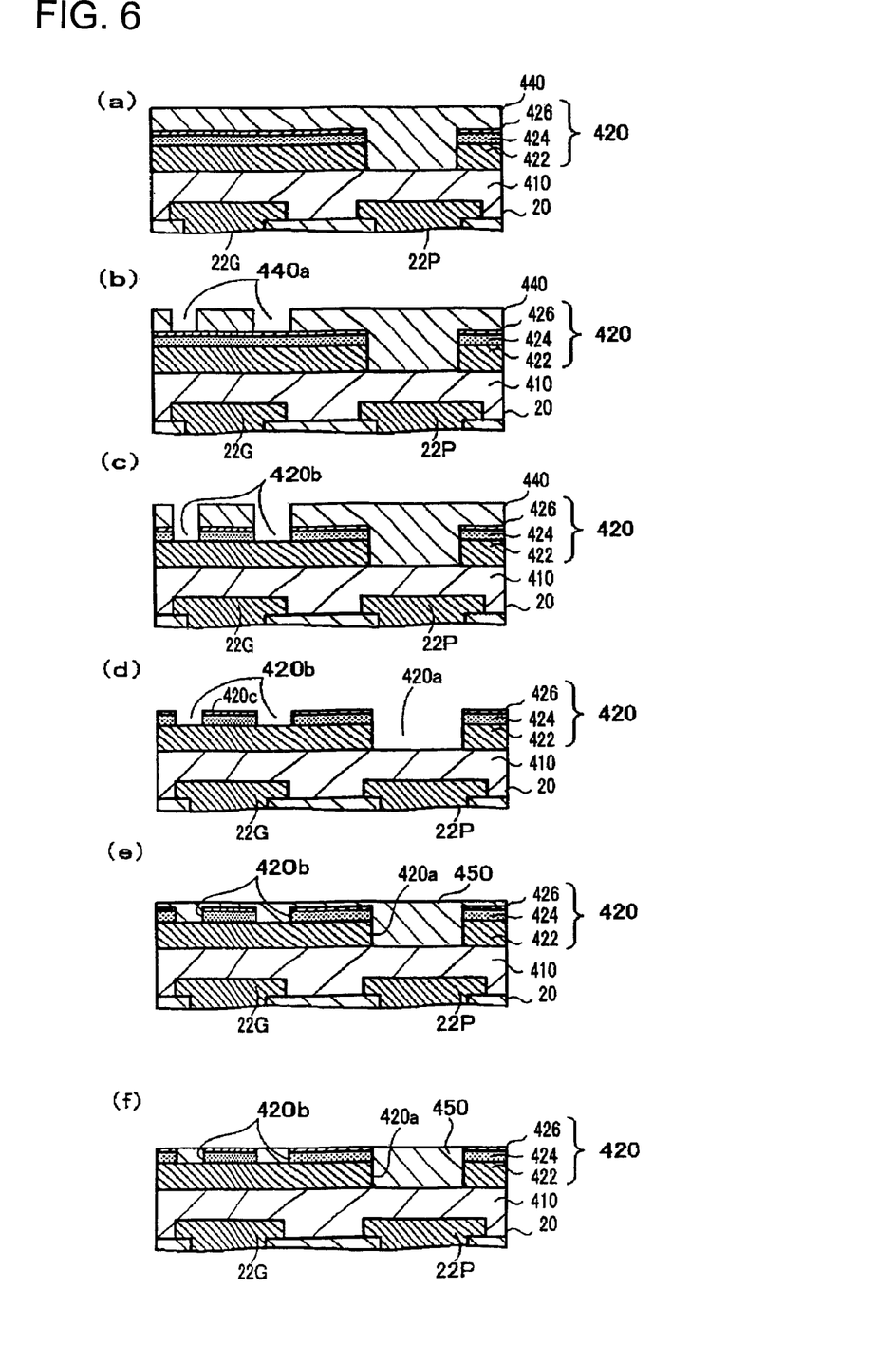
FIGS. 6(a)-6(f) are cross-sectional views of multilayered PCB under production after the steps shown in FIGS. 5(a)-5(f)

Referring to FIGS. 6(a)-6(d), a dry film 440 is attached on the unfinished substrate having high-dielectric sheet 420 with a pattern (see FIG. 6(a)), a doughnut shaped groove (440a) ("doughnut shape" in a plan view) is formed at a position opposing conductive layer (22G) of core substrate 20 (see FIG. 6(b)), etching is performed (see FIG. 6(c)), and then the dry film 440 is removed (see FIG. 6(d)). As a result, a doughnut groove (420b) is formed in high-dielectric sheet 420 at the position opposing conductive layer (22G) of core substrate 20. In the etching process, a copper (II) chloride etching solution is used for a short time such that after metal foil 426 and high-dielectric layer 424 is etched, metal foil 422 is slightly etched. The portion surrounded by doughnut groove (420b) becomes an island part (420c) which resembles a circular shape on a plan view. When etching an opening of dry film 440, only metal film 426 may be removed to form doughnut groove (426b), or metal film 426 and a portion of high-dielectric layer 424 may be removed to form doughnut groove (426b).

Referring to FIGS. 6(e)-6(f), cylindrical hole (420a) and doughnut groove (420b) are filled with an interlayer filling resin 450 by using a squeegee (see FIG. 6(e)), and then dried for 20 minutes at 100° C. Interlayer filling resin 450 is prepared by mixing and blending in a container 100 parts by weight of bisphenol F-type epoxy monomer (molecular weight 310, YL983U, made by Japan Epoxy Resins Co., Ltd.), 72 parts by weight of spherical particular $SiO_2$ having an average particle diameter 1.6 μm and coated with a silane coupling agent (CRS1101-CE, made by Atotech Japan) and 1.5 parts by weight of a leveling agent (Perenol S4, made by San Nopco Ltd.). The viscosity of the resin is adjusted to 30-60 Pa/s at a temperature of 23±1° C. As a hardening agent, 6.5 parts by weight of imidazole hardening agent (2E4MZ-CN, made by Shikoku Chemicals Corp.) is used. After the resin is filled and dried, the surface of the unfinished substrate is ground until metal foil 426 of high-dielectric sheet 420 is exposed and the exposed surface become flat. Interlayer filling resin 450 is then hardened by heating treatment which is for an hour at 100° C. and for an hour at 150° C. (see FIG. 6(f)). As a result, cylindrical hole (420a) and doughnut groove (420b) are filled with interlayer filling resin 450.

Figure 7:
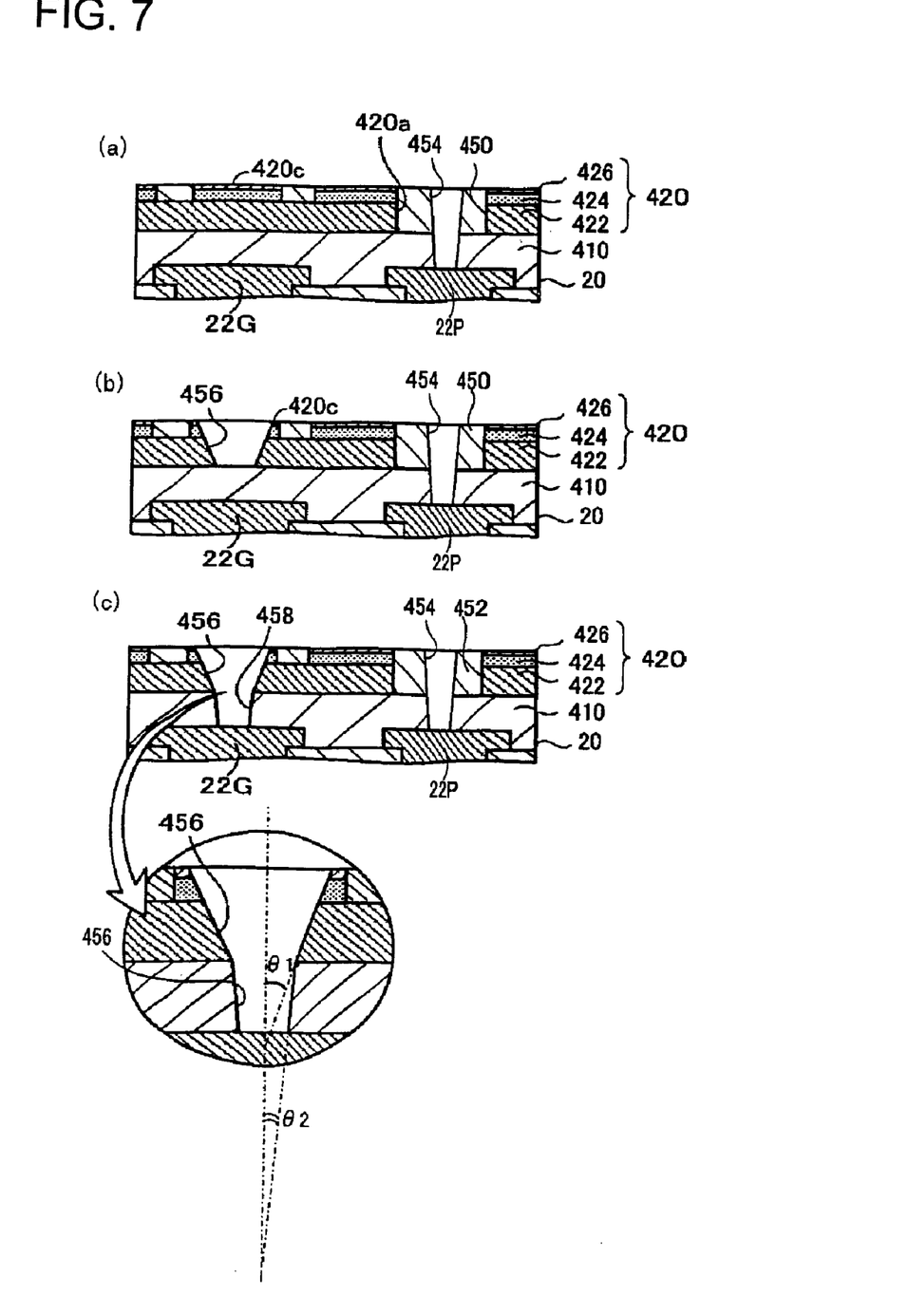
FIGS. 7(a)-7(c) are cross-sectional views of multilayered PCB under production after the steps shown in FIGS. 6(a)-6(f)

Referring to FIGS. 7(a)-7(c), cylindrical hole (420a) filled with interlayer filling resin 450 is irradiated with a $CO_2$ laser such that a power source tapering hole 454 which reaches the surface of conductive layer (22P) of core substrate 20 is formed (see FIG. 7(a)). A $CO_2$ laser makes a hole in interlayer filling resin 450, but is unlikely to make a hole in conductive layer (22P), thus making it easy to form a power source tapering hole 454 reaching down to the surface of conductive layer (22P). Island portion (420c) resembling a circular shape in a plan view is irradiated with a UV laser such that a first ground tapering hole 456 which passes through metal film 422 is formed in island portion (420c) (see FIG. 7(b)). Conditions for the irradiation of a UV laser are as follows: 3-10 W output; 25-60 kHz frequency; and 50-200 irradiations. More specifically, the initial irradiation is performed with 3 W output, 25 kHz frequency, and laser output power set at maximum, and then the output power is gradually decreased as the number of irradiations increases. As a result, the taper angle of first ground tapering hole 456 is made relatively large. Then, a portion of interlayer insulation layer 410 facing the bottom of first ground tapering hole 456 is irradiated by using a $CO_2$ gas laser such that a second ground tapering hole 458 which reaches conductive layer (22G) of core substrate 20 is formed (see FIG. 7(c)). Taper angle (θ1) of first ground tapering hole 456 is made larger than taper angle (θ2) of second ground tapering hole 458. When using a $CO_2$ gas laser with a wavelength of 9.4 μm, conditions for irradiating the $CO_2$ gas laser are as follows: 1.0-5.0 mm for a diameter of mask's through-hole; 1-5 irradiations; 3-30 μsec for pulse width; and 5-50 mj/$cm^2$ of energy density. More specifically, the initial irradiation is performed with an energy density of 15 mj/$cm^2$ and pulse width of 15 μsec, and then the energy density and pulse width are decreased as the number of irradiations increased. By adjusting energy density and pulse width of a $CO_2$ gas laser, taper angle (θ2) is changed. A $CO_2$ gas laser makes a hole in interlayer insulating layer 410, but is unlikely to make a hole in conductive layer (22G) or widen a hole diameter of metal foil 422, thus making it easy to form second ground tapering hole 458 reaching down to conductive layer (22G) while retaining the original shape of first ground tapering hole 456.

Figure 8:
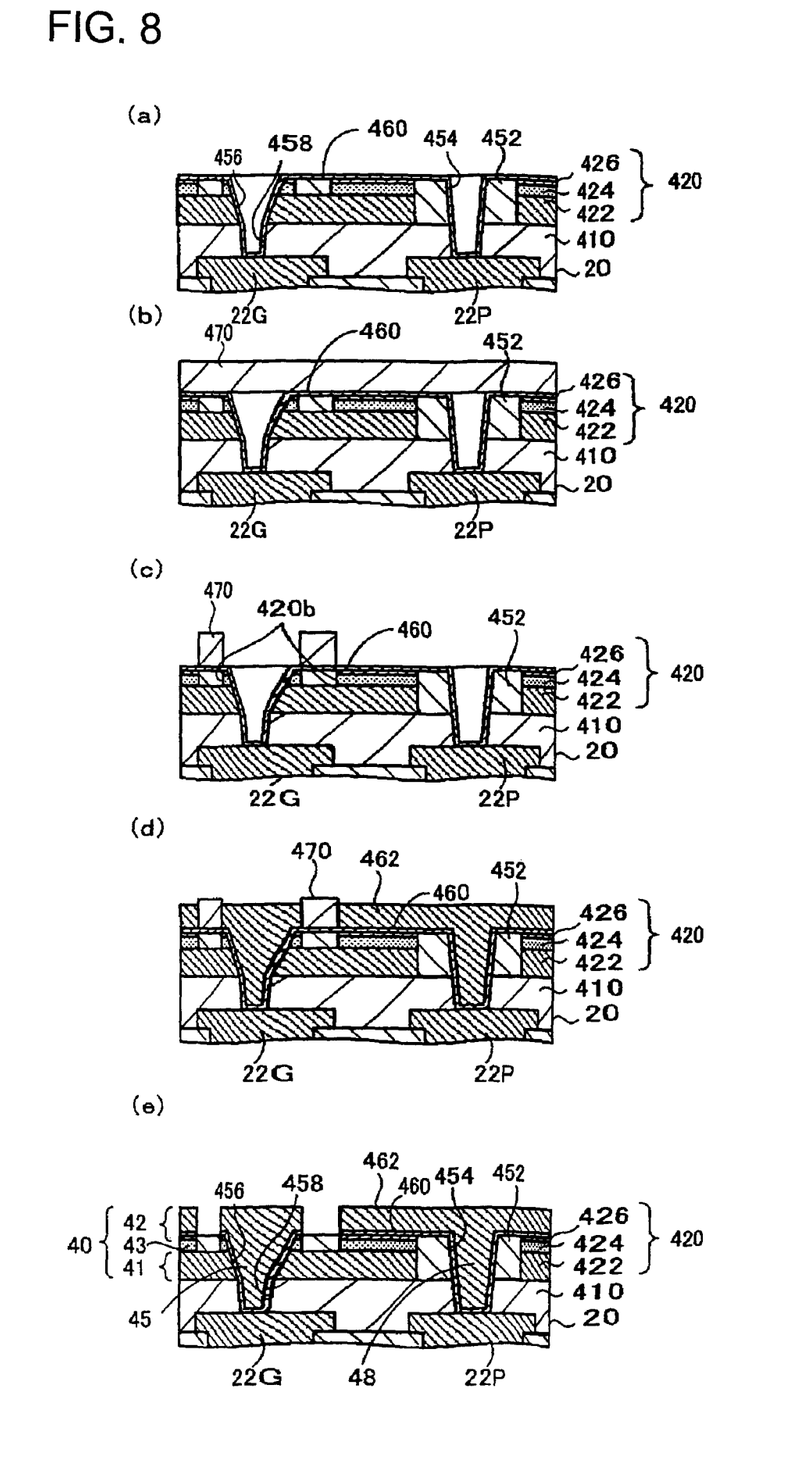
FIGS. 8(a)-8(e) are cross-sectional views of multilayered PCB under production after the steps shown in FIGS. 7(a)-7(c)

Referring to FIGS. 8(a)-8(e), after applying catalyst for electroless plating to the surface of unfinished substrate (including the bottom and side surfaces of tapering holes 454, 456, 458), the substrate is immersed in an electroless copper plating solution, and an electroless copper film 460 with a thickness in the range of 0.6-3.0 μm is formed on the surface of substrate (see FIG. 8(a)). The composition of the electroless copper plating solution for the above procedure is as follows: 0.03 mol/L of copper sulfate; 0.200 mol/L of EDTA; 0.1 g/L HCHO; 0.1 mol/L of NaOH; 100 mg/L of α,α'-bipyridyl; 0.1 g/L of polyethylene glycol (PEG). A dry film 470 is attached on electroless copper plating film 460 (see FIG. 8(b)), then exposure, development and etching are performed such that remaining dry film 470 is only over the area opposing doughnut groove (420b) (see FIG. 8(c)), and an electrolytic copper plating film 462 having a thickness of 25 µm is formed on the surface of electroless copper plating film 460, except the area covered with dry film 470 (see FIG. 8(d)). The composition of the electrolytic copper plating solution for the above procedure is as follows: 200 g/L of sulfuric acid; 80 g/L of copper sulfate; and 19.5 ml/L of additive (Cupracid GL, made by Atotech Japan). Conditions of the electrolytic copper plating are as follows: a power density of 1 A/dm$^2$ for 115 minutes at a temperature of 23±2° C. After dry film 470 is removed, the portion of electroless copper plating film 460 which has been covered with the dry film 470 is etched by using a sulfuric acid/hydrogen peroxide based etching solution (see FIG. 8(e)). Through these procedures, thin-film capacitor 40 is formed on core substrate 20. More specifically, metal foil 422 is formed into lower electrode 41, high-dielectric layer 424 is formed into high-dielectric layer 43, and portions of metal foil 426, electroless copper plating film 460 and electrolytic copper film 462 over high-dielectric layer 424 correspond to upper electrode 42. Further, portions of electroless copper plating film 460 and electrolytic copper plating film 462 filling first and second ground tapering holes 456, 458 correspond to lower via-hole conductor 45, and portions of electroless copper plating film 460 and electrolytic copper plating film 462 filling power source tapering hole 454 correspond to upper via-hole conductor 48.

Figure 9:
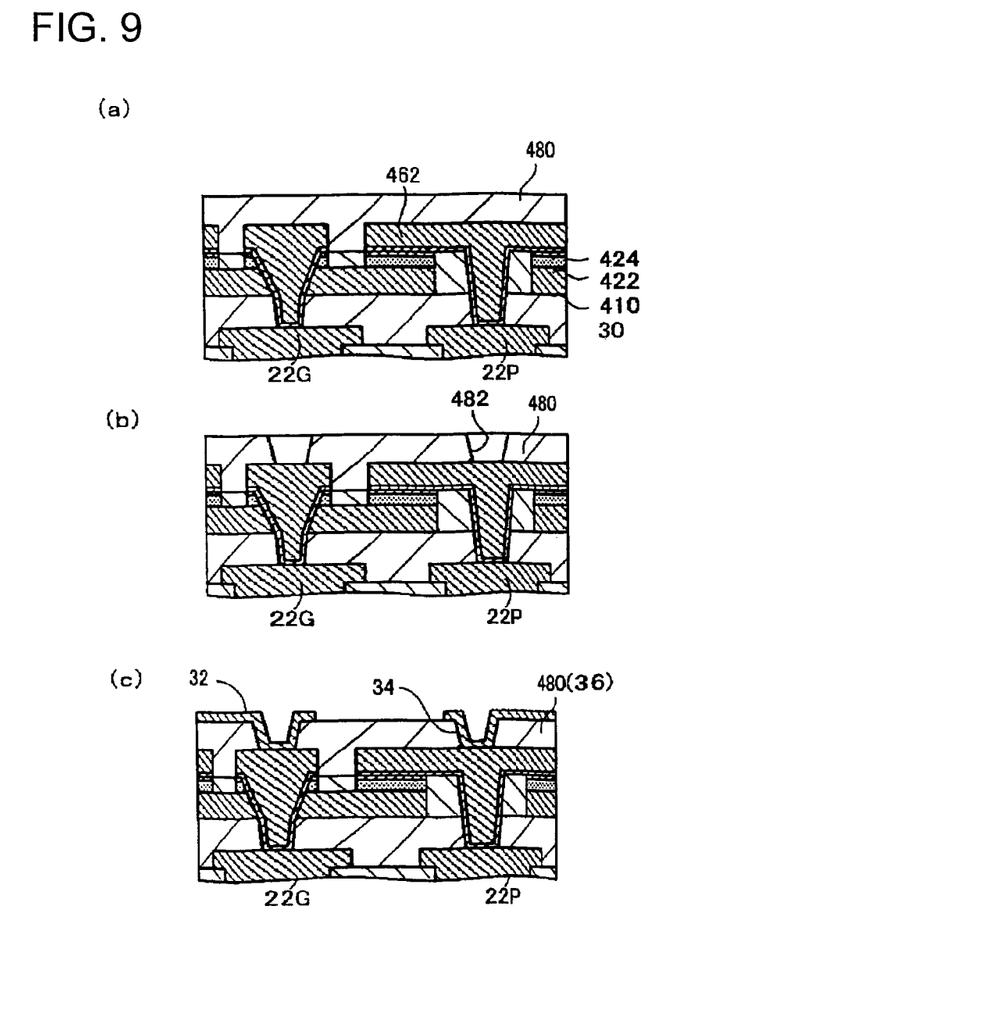
FIGS. 9(a)-9(c) are cross-sectional views of multilayered PCB under production after the steps shown in FIGS. 8(a)-8(e)

FIGS. 9(a)-9(c) are cross-sectional views of multilayered PCB 10 under production after the steps shown in FIGS. 8(a)-8(e). Electrolytic copper plating film 462 formed on the unfinished substrate is treated in a blackening bath (oxidation bath) using a solution which contains NaOH (10 g/L), NaClO$_2$ (40 g/L), and Na$_3$PO$_4$ (6 g/L), and in a reduction bath using a solution which contains NaOH (10 g/L) and NaBH$_4$ (6 g/L), to form a roughened surface on electrolytic copper plating film 462 (not shown in the drawing). Then, referring to FIG. 9(a), a resin insulating sheet 480 is attached on thin-film capacitor 40 by using a vacuum laminator under conditions of a temperature in the range of 50-150° C. and a pressure in the range of 0.5-1.5 MPa, and then hardened for three hours at 150° C. This resin insulating sheet 480 may be denatured epoxy type resin sheet, polyphenylene ether type resin sheet, polyimide type resin sheet, cyano ester type resin sheet or imide type resin sheet. Those sheets may contain thermoplastic resins such as polyolefin type resin or polyimide type resin, thermosetting resins such as silicone resin, and/or rubber type resins such as SBR, NBR or urethane, and may also contain fiber-, filler- or flat-shaped inorganic materials such as silica, alumina or zirconia dispersed therein. Referring to FIG. 9(b), a hole 482 is formed at a predetermined position of resin insulating sheet 480 by using a CO$_2$ laser. After performing a roughening process and electroless copper plating, a plating resist is provided and exposure and development are performed, thereby patterning the plating resist. Then, electrolytic copper plating is performed, and the plating resist is removed. Referring to FIG. 9(c), portions of the electroless copper-plated film which have been covered with the plating resist are removed by etching, and BU conductive layer 32 is formed. Duration of electro-plating is controlled such that BU conductive layer 32 is made thinner than lower electrode 41. More specifically, BU conductive layer 32 is formed to have a thickness of 12 µm. In FIG. 9(c), resin insulating sheet 480 is formed into BU insulating layer 36, and the plating inside the hole 482 correspond to via-hole conductor 34. By repeating the processes in FIGS. 9(a)-9(c), BU part 30 as seen in FIG. 2 is formed. Electrodes which are to become pads 61, 62, 63 are formed on the topmost layer of BU part 30, and a multilayered PCB 10 shown in FIGS. 1 and 2 is formed.

Figure 10:
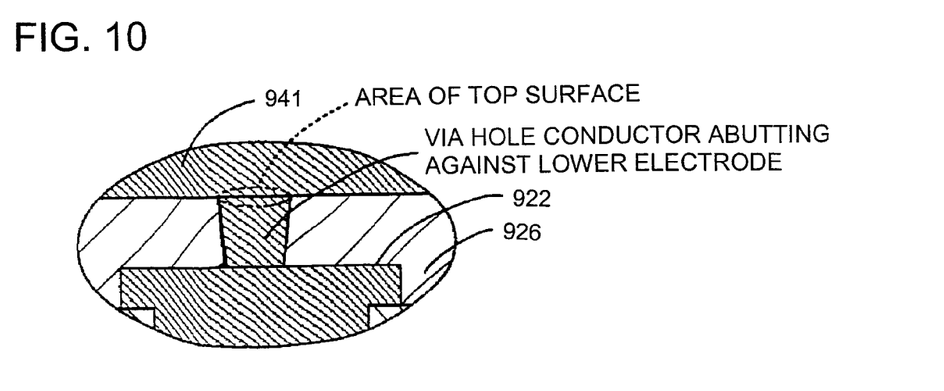
FIG. 10 is an illustration of comparative example.

According to multilayered PCB 10 described above, an area of contact between thin-film capacitor 40 and lower via-hole conductor 45 corresponds to a side surface of lower electrode through-hole (41b), and thus it is larger compared to multilayered PCB having lower via-hole conductor 945 abutting against the bottom surface of lower electrode 941 as shown in FIG. 10. Specifically, when via-hole conductor 945 is formed to abut against lower electrode 941, an area of contact between lower electrode 941 of thin-film capacitor 940 and lower via-hole conductor 945 is the top surface of lower via-hole conductor 945, i.e., it is comparable to the bottom area of lower electrode through-hole (41b) in multilayered PCB 10. On the other hand, an area of contact between lower electrode 41 of thin-film capacitor 40 and lower via-hole conductor 45 is a lateral surface area of lower electrode through-hole (41b), which is made larger than the bottom area of lower electrode through-hole (41b). Therefore, an area of contact between lower electrode 41 of thin-film capacitor 40 and lower via-hole conductor 45 is made larger, compared to an area of contact where lower via-hole conductor 945 is abutting against the bottom surface of lower electrode 941. As a result, it is significantly difficult to disconnect lower via-hole conductor 45 and lower electrode 41 after heat-cycle test, thus preventing defects caused by heat-cycle test.

In lower via-hole conductor 45, the generatrices of insulation layer through-hole (26b) and lower electrode through-hole (41b) form an angle at junction (J). As such, lower via-hole conductor 45 is made more flexible around the angled portion, thus dispersing stress better.

Lower electrode 41 is formed thicker than BU conductive layer 32 of BU part 30, and thus it is relatively easy to enlarge an area of contact between lower electrode 41 of thin-film capacitor 40 and lower via-hole conductor 45. Also, lower electrode 41 has a lower resistance.

In lower via-hole conductor 45, the diameter (Φvia-b) of its bottom portion in contact with conductive layer 22 of core substrate 20 is smaller than the diameter (Φbu-b) of the bottom portion in BU via-hole conductor 34, and thus multilayered PCB 10 is more resistant against stress. That is, lower via-hole conductor 45 is abutting against conductive layer (22G) of core substrate 20, but its lateral surface makes contact with lower electrode 41. Thus, lower via-hole conductor 45 and lower electrode 41 make better contact. BU via-hole conductor 34 abuts against upper electrode 42 and BU conductive layer 32 in contact, and thus if stress is exerted to those contact areas, their contact may be easily separated. Accordingly, the area of the bottom portion of lower via-hole conductor 45 is formed smaller than the area of the bottom portion of BU via-hole conductor 34, thereby shifting stress more toward lower via-hole conductor 45 and reducing stress on BU via-hole conductor 34. Consequently, multilayered PCB 10 as a whole is more resistant against stress.

The present invention is not limited to the above-described embodiments, but within the technical scope of the present invention, various embodiments may be implemented.

For example, in the above-described embodiment, thin-film condenser 40 is formed on top of core substrate 20 and build-up part 30 is formed on the thin-film capacitor 40. However, build-up part 30 may be formed on top of core substrate 20, and thin-film capacitor 40 may be formed on build-up part 30. In such an embodiment, a diameter (Φvia-b) of the surface of lower via-hole conductor 45 is an area where lower via-hole conductor 45 makes contact with BU conductive layer 32 of build-up part 30.

In the above-described embodiment, insulating layer through-hole (26b) is formed in a truncated-cone shape, tapering downward. However, insulating layer through-hole (26b) may be formed in a cylindrical shape, whose cross-section has the same dimension as the bottom of lower electrode through-hole (41b). In such an embodiment, lower via-hole conductor 45 forms an angle at the juncture of lower electrode through-hole (41b) and insulating layer through-hole (26b), and thus better withstands stress.

In the above-described embodiment, taper angle (θ1) of lower electrode through-hole (41b) is made greater than taper angle (θ2) of insulating layer through-hole (26b). However, taper angles (θ1, θ2) may be substantially the same. In such an embodiment, the generatrices of lower via-hole conductor 45 do not form an angle at the juncture of lower electrode through-hole (41b) and insulating layer through-hole (26b), but if an area of contact between lower electrode 41 of thin-film condenser 40 and lower via-hole conductor 45 is made larger, compared to a surface of lower via-hole conductor 945 abutting the surface of lower electrode 941, lower via-hole conductor 45 and lower electrode 41 are still less likely to be separated after a heat-cycle test.

In the above-described embodiment, a cross-section of BU via-hole conductor 34 is in a cup shape (i.e., a "conformal via"), but BU via-hole conductor 34 may be a filled via which has a metal or conductive resin filling inside the cup shape.

EXAMPLES

According to the above-described processes for manufacturing multilayered PCB 10, Examples 1-19 were prepared by changing the thickness of the nickel foil or adjusting irradiation conditions of UV and $CO_2$ lasers as shown in Table 1. Each of Examples 1-19 and Comparative Example 1 was tested and evaluated as follows. Among ground pads 61 and power source pads 62 formed on mounting part 60 of multilayered PCB 10, several pads were selected. Resistance between selected ground pads 61 and external ground terminals electrically connected to selected ground pads 61 was measured. Similarly, resistance between selected power source pads 62 and external power source terminals electrically connected to selected power source pads 62 was measured. Each of their results was set as an initial value (R0). Then, a voltage of 3.3V was applied between upper electrode 42 and lower electrode 41 of thin-film capacitor 40, thereby charging thin-film capacitor 40, and later it was discharged. This process of charging and discharging was repeated fifty times. Furthermore, a heat cycle test, in which multilayered PCB 10 was left at −55° C. for 5 minutes and at 125° C. for 5 minutes, was repeated five hundred times. Thereafter, resistance (R) between pads and their corresponding external terminals, where initial values (R0) were measured earlier, was measured. For each set of pads and their corresponding external terminals, initial value R0 was subtracted from resistance (R), and the result was divided by initial value (R0) and multiplied by 100, (that is, 100×(R−R0)/R0). If all the values obtained were within the range of ±10%, examples were given "Pass" (indicated as "o"), and if not, examples were given "Fail" (indicated as "x"). These results are shown in Table 1. The multilayered PCBs 10 in Examples and Comparative Example basically have the same structures as shown in FIGS. 1 and 2, with the material, size and position of each element remaining constant, except that the parameters in Table 1 were set as shown in Table 1.

TABLE 1

| | | *1 | | | lower via-hole conductor | | | | evaluation results | | | | | |
|---|---|---|---|---|---|---|---|---|---|---|---|---|---|---|
| | | Φbu-b | TL | *2 | Φvia-t | Φvia-m | Φvia-b | | *3 | | | | | | |
| | | (μm) | (μm) | ΔT | (μm) | (μm) | (μm) | shape | ΔS | 250 | 500 | 750 | 1000 | 1250 | 1500 |
| EXAMPLES | 1 | 50 | 14 | >0 | 65 | 58 | 43 | S | >0 | ○ | ○ | ○ | X | X | X |
| | 2 | 50 | 14 | >0 | 65 | 51 | 21 | S | >0 | ○ | ○ | X | X | X | X |
| | 3 | 50 | 14 | >0 | 65 | 58 | 48 | A | >0 | ○ | ○ | ○ | ○ | ○ | ○ |
| | 4 | 50 | 14 | >0 | 65 | 51 | 47 | A | >0 | ○ | ○ | ○ | ○ | ○ | ○ |
| | 5 | 50 | 20 | >0 | 65 | 55 | 40 | S | >0 | ○ | ○ | ○ | ○ | X | X |
| | 6 | 50 | 20 | >0 | 65 | 45 | 15 | S | >0 | ○ | ○ | X | X | X | X |
| | 7 | 50 | 20 | >0 | 65 | 55 | 47 | A | >0 | ○ | ○ | ○ | ○ | ○ | ○ |
| | 8 | 50 | 20 | >0 | 65 | 45 | 42 | A | >0 | ○ | ○ | ○ | ○ | ○ | ○ |
| | 9 | 50 | 30 | >0 | 65 | 40 | 25 | S | >0 | ○ | ○ | X | X | X | X |
| | 10 | 50 | 30 | >0 | 65 | 35 | 5 | S | >0 | ○ | ○ | X | X | X | X |
| | 11 | 50 | 30 | >0 | 65 | 40 | 40 | A | >0 | ○ | ○ | ○ | ○ | ○ | ○ |
| | 12 | 50 | 30 | >0 | 65 | 35 | 35 | A | >0 | ○ | ○ | ○ | ○ | ○ | ○ |
| | 13 | 50 | 20 | >0 | 50 | 45 | 40 | A | >0 | ○ | ○ | ○ | ○ | ○ | ○ |
| | 14 | 50 | 30 | >0 | 70 | 55 | 45 | A | >0 | ○ | ○ | ○ | ○ | ○ | ○ |
| | 15 | 50 | 30 | >0 | 75 | 45 | 42 | A | >0 | ○ | ○ | ○ | ○ | ○ | ○ |
| | 16 | 50 | 20 | >0 | 45 | 40 | 38 | A | >0 | ○ | ○ | ○ | ○ | ○ | ○ |
| | 17 | 50 | 30 | >0 | 70 | 55 | 50 | A | >0 | ○ | ○ | ○ | ○ | ○ | X |
| | 18 | 50 | 30 | >0 | 70 | 55 | 52 | A | >0 | ○ | ○ | ○ | ○ | ○ | X |
| | 19 | 30 | 40 | >0 | 80 | 60 | 40 | S | >0 | ○ | X | X | X | X | X |
| Comp 1 | | 30 | 10 | <0 | 65 | 60 | 45 | S | <0 | X | X | X | X | X | X |

Figure 11:
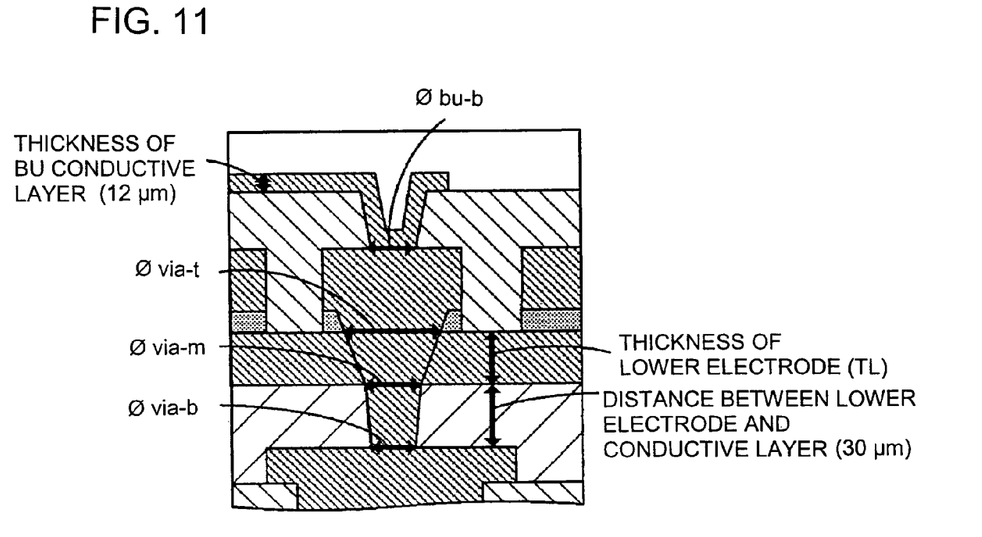
FIG. 11 is a cross-sectional view of multilayered PCB illustrating the parameters in Table 1.

*1 For each parameter (such as Φbu-b, TL, Φvia-t, Φvia-m, Φvia-b), see FIG. 11
*2 ΔT is a value obtained by subtracting the thickness of the circuit-pattern on the BU part (12 μm) from the thickness of the lower electrode TL (if the latter is larger, ΔT > 0; if the former is larger, ΔT < 0.)
*3 ΔS is a value obtained by subtracting the bottom area of the lower electrode through-hole from the side area of the lower electrode through-hole (if the latter is larger, ΔS > 0; if the former is larger, ΔS < 0.).
Note:
In the shape column, "S" indicates a straight line and "A" indicates an angled line.

As is seen from Table 1, the results of heat cycle tests in Examples 1-19 were superior compared to those in Comparative Example 1. In Examples 1-19, area of contact between lower electrode 41 of the thin-film capacitor 40 and lower via-hole conductor 45 (side surfaces of lower electrode through-hole (41*b*)) is larger, compared to area of contact where lower via-hole conductor abuts against a surface of lower electrode (i.e., bottom area of lower electrode through-hole (941*b*) as seen in FIG. 10). Also, lower electrode 41 is made thicker than BU conductive layers 32 of build-up part 30. In Examples 3, 4, 7, 8 and 11-18, where lower via-hole conductor 45 is angled (namely, taper angle θ1>θ2), compared with Examples 1, 2, 5, 6, 9, 10 and 19, where lower via-hole conductor 45 is not angled (namely, taper angle θ1=θ2), resistance values remained excellent even after a heat cycle test was repeated over one thousand two hundred and fifty times. In Examples 14, 17 and 18, parameters were set the same, except that the diameter (Φvia-b) of bottom portion of lower via-hole conductor 45 differs in each example. Specifically, in Example 14, the diameter (Φvia-b) of bottom portion of lower via-hole conductor 45 was made smaller than the diameter (Φbu-b) of bottom portion of BU via-hole conductor 34, whereas in Examples 17 and 18, the diameter (Φvia-b) of bottom portion of lower via-hole conductor 45 was the same as or greater than the diameter (Φbu-b) of bottom portion of BU via-hole conductor 34. The results of Example 14 were superior compared with those in Examples 17 and 18.

Throughout this specification, descriptions are made by using terms such as "top" and "bottom" for explaining the positional relationships of the structural elements in the drawings. However, structures are not limited to those described above, and positions may be upside down or opposite in right and left sides.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for manufacturing a printed circuit board, comprising:
   preparing a structure including at least one conductor portion, an insulating layer formed over the conductor portion, and a thin-film capacitor formed over the insulating layer and comprising a first electrode, a second electrode and a high-dielectric layer interposed between the first electrode and the second electrode;
   forming a first hole passing through the thin-film capacitor and having a truncated-cone shape tapering toward the conductor portion;
   forming a second hole passing through the insulating layer and reaching the conductor portion; and
   filling at least one conductive material in the first and second holes such that a via-hole conductor structure through the second electrode and insulating layer and electrically connecting the second electrode and the conductor portion is formed,
   wherein the forming of the first and second holes comprises irradiating the thin-film capacitor and the insulating layer with at least one laser device.

2. The method according to claim 1, wherein the filling of at least one conductive material comprises plating the first and second holes with at least one metal.

3. The method according to claim 1, wherein the filling of at least one conductive material comprises performing an electroless metal plating and an electrolytic metal plating.

4. The method according to claim 1, wherein the filling of at least one conductive material comprises performing an electroless copper plating and an electrolytic copper plating.

5. A method for manufacturing a printed circuit board, comprising:
   preparing a structure including at least one conductor portion, an insulating layer formed over the conductor portion, and a thin-film capacitor formed over the insulating layer and comprising a first electrode, a second electrode and a high-dielectric layer interposed between the first electrode and the second electrode;
   forming a first hole passing through the thin-film capacitor and having a truncated-cone shape tapering toward the conductor portion;
   forming a second hole passing through the insulating layer and reaching the conductor portion; and
   filling at least one conductive material in the first and second holes such that a via-hole conductor structure through the second electrode and insulating layer and electrically connecting the second electrode and the conductor portion is formed,
   wherein the forming of the first hole comprises irradiating the thin-film capacitor with a UV laser and the forming of the second hole comprises irradiating the insulating layer with a $CO_2$ gas laser.

6. The method according to claim 5, wherein the filling of at least one conductive material comprises plating the first and second holes with at least one metal.

7. The method according to claim 5, wherein the filling of at least one conductive material comprises performing an electroless metal plating and an electrolytic metal plating.

8. The method according to claim 5, wherein the filling of at least one conductive material comprises performing an electroless copper plating and an electrolytic copper plating.

9. A method for manufacturing a printed circuit board, comprising:
   preparing a structure including at least one conductor portion, an insulating layer formed over the conductor portion, and a thin-film capacitor formed over the insulating layer and comprising a first electrode, a second electrode and a high-dielectric layer interposed between the first electrode and the second electrode;
   forming a first hole passing through the thin-film capacitor and having a truncated-cone shape tapering toward the conductor portion;
   forming a second hole passing through the insulating layer and reaching the conductor portion; and
   filling at least one conductive material in the first and second holes such that a via-hole conductor structure through the second electrode and insulating layer and electrically connecting the second electrode and the conductor portion is formed,
   wherein the forming of the first hole comprises irradiating the thin-film capacitor with a laser device and gradually decreasing an output power of the laser device.

10. The method according to claim 9, wherein the filling of at least one conductive material comprises plating the first and second holes with at least one metal.

11. The method according to claim 9, wherein the filling of at least one conductive material comprises performing an electroless metal plating and an electrolytic metal plating.

12. The method according to claim 9, wherein the filling of at least one conductive material comprises performing an electroless copper plating and an electrolytic copper plating.

13. A method for manufacturing a printed circuit board, comprising:

preparing a structure including at least one conductor portion, an insulating layer formed over the conductor portion, and a thin-film capacitor formed over the insulating layer and comprising a first electrode, a second electrode and a high-dielectric layer interposed between the first electrode and the second electrode;

forming a first hole passing through the thin-film capacitor and having a truncated-cone shape tapering toward the conductor portion;

forming a second hole passing through the insulating layer and reaching the conductor portion; and filling at least one conductive material in the first and second holes such that a via-hole conductor structure through the second electrode and insulating layer and electrically connecting the second electrode and the conductor portion is formed, wherein the filling of at least one conductive material comprises performing an electroless metal plating and an electrolytic metal plating.

14. The method according to claim 13, wherein the forming of the first and second holes comprises irradiating the thin-film capacitor and the insulating layer with at least one laser device.

15. The method according to claim 13, wherein the forming of the first hole comprises irradiating the thin-film capacitor with a UV laser and the forming of the second hole comprises irradiating the insulating layer with a $CO_2$ gas laser.

16. The method according to claim 13, wherein the forming of the first hole comprises irradiating the thin-film capacitor with a laser device and gradually decreasing an output power of the laser device.

17. A method for manufacturing a printed circuit board, comprising:

preparing a structure including at least one conductor portion, an insulating layer formed over the conductor portion, and a thin-film capacitor formed over the insulating layer and comprising a first electrode, a second electrode and a high-dielectric layer interposed between the first electrode and the second electrode;

forming a first hole passing through the thin-film capacitor and having a truncated-cone shape tapering toward the conductor portion;

forming a second hole passing through the insulating layer and reaching the conductor portion; and filling at least one conductive material in the first and second holes such that a via-hole conductor structure through the second electrode and insulating layer and electrically connecting the second electrode and the conductor portion is formed, wherein the filling of at least one conductive material comprises performing an electroless copper plating and an electrolytic copper plating.

18. The method according to claim 17, wherein the forming of the first and second holes comprises irradiating the thin-film capacitor and the insulating layer with at least one laser device.

19. The method according to claim 17, wherein the forming of the first hole comprises irradiating the thin-film capacitor with a UV laser and the forming of the second hole comprises irradiating the insulating layer with a $CO_2$ gas laser.

20. The method according to claim 17, wherein the forming of the first hole comprises irradiating the thin-film capacitor with a laser device and gradually decreasing an output power of the laser device.

* * * * *